United States Patent
Pitts et al.

(10) Patent No.: US 8,093,716 B2
(45) Date of Patent: Jan. 10, 2012

(54) CONTACT FUSE WHICH DOES NOT TOUCH A METAL LAYER

(75) Inventors: Robert L. Pitts, Dallas, TX (US); Bryan Sheffield, McKinney, TX (US); Roger Griesmer, Murphy, TX (US); Joe McPherson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 608 days.

(21) Appl. No.: 11/192,825

(22) Filed: Jul. 29, 2005

(65) Prior Publication Data

US 2007/0023859 A1    Feb. 1, 2007

(51) Int. Cl.
    *H01L 23/34* (2006.01)
(52) U.S. Cl. ......... 257/723; 361/760; 361/761; 174/260
(58) Field of Classification Search .............. 257/50, 257/209, 529
    See application file for complete search history.

(56) References Cited

U.S. PATENT DOCUMENTS

| 6,573,585 B2* | 6/2003 | Arndt et al. ............... 257/529 |
| 6,661,330 B1 | 12/2003 | Young |
| 6,867,441 B1* | 3/2005 | Yang et al. ............... 257/209 |
| 7,193,292 B2* | 3/2007 | Liaw ............... 257/529 |
| 2004/0061233 A1* | 4/2004 | Matsubara et al. ........... 257/758 |
| 2005/0189613 A1* | 9/2005 | Otsuka et al. ............ 257/529 |

OTHER PUBLICATIONS

Patent application for "Metal Contact Fuse Element", U.S. Appl. No. 10/840,444.

* cited by examiner

*Primary Examiner* — Samuel Gebremariam
(74) *Attorney, Agent, or Firm* — Warren L. Franz; Wade J. Brady, III; Frederick J. Telecky, Jr.

(57) ABSTRACT

The present invention provides a semiconductor device fuse, comprising a metal layer and a first semiconductor layer that electrically couples the metal layer to a fuse layer, wherein the fuse layer is spaced apart from the metal layer. The semiconductor device fuse further comprises a second semiconductor layer that forms a blow junction interface with the fuse layer. The blow junction interface is configured to form an open circuit when a predefined power is transmitted through the second semiconductor layer to the fuse layer.

43 Claims, 6 Drawing Sheets

CONTACT FUSE WHICH DOES NOT TOUCH A METAL LAYER

TECHNICAL FIELD OF THE INVENTION

The present invention is directed, in general, to fuses for use in integrated circuits.

BACKGROUND OF THE INVENTION

Fuses are being incorporated with increasing frequency to improve manufacturing yield or to design application specific integrated circuits. Fuses are selectively blown, or programmed, to allow redundant components to replace defective components in the circuit, or to adapt an integrated circuit to perform a specific operation. To program the integrated circuit for a specific task, fuses embedded in the circuit are either kept intact to maintain a conduction path, or blown to create an open circuit, according to a predefined design.

Large numbers of fuses are presently used to implement increasingly sophisticated integrated circuit programming. The implementation of a particular design can require the blowing of thousands of fuses on an integrated circuit die. To obtain high numbers of properly programmed devices, the fuses must be blown with extremely high yield (e.g., 99.99%). Continuing refinements in the materials and process used to fabricate integrated circuits with increasingly smaller and faster transistor components present constant new challenges to fuse designs.

For instance, fuses are typically constructed of the same materials as used to fabricate transistors or other active or passive device components. Changes in the type of polysilicon or metal silicide, or in their thicknesses, doping or other parameters used for transistor fabrication, and hence fuse device fabrication, can dramatically decrease one's ability to blow fuses in high yields. In some cases a high blow yield can be restored by changing the amount or timing of power applied to the fuse. In other cases a different fuse structure must be designed. Both of these measures increase manufacturing costs and delay integrated circuit production.

Accordingly, what is needed in the art is a semiconductor device fuse that can be reliably programmed independent of changes made in transistor manufacturing materials and processes.

SUMMARY OF THE INVENTION

To address the above-discussed deficiencies of the prior art, the present invention provides in one embodiment, a semiconductor fuse device. The fuse device comprises a first semiconductor layer that electrically couples the metal layer to a fuse layer. The fuse layer is spaced apart from the metal layer. The fuse device also comprises a second semiconductor layer that forms a blow junction interface with the fuse layer. The blow junction interface is configured to form an open circuit when a predefined power is transmitted through the second semiconductor layer to the fuse layer.

Another aspect of the present invention is a method of manufacturing a semiconductor fuse device. First and second semiconductor layers are formed over a substrate. A fuse layer is deposited over the substrate, a portion of the fuse layer being on the first semiconductor layer. The fuse layer forms the above-described blow junction interface with the second semiconductor layer. A metal layer is deposited over the first semiconductor layer, wherein the metal layer is electrically coupled to the fuse layer through the first semiconductor layer and the metal layer is separated from the fuse layer.

Still another embodiment of the present invention is an integrated circuit. The integrated circuit comprises the above-described semiconductor device fuse and microelectronic devices. The semiconductor device fuse is configured to be programmed to interconnect the microelectronic devices and form an operative device.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

For a more complete understanding of the present invention, reference is now made to the following detailed description taken in conjunction with the accompanying figures. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

As part of the present invention it was discovered that incorporating a metal contact into a fuse device results in a fuse that can be blown with high reliably. Moreover such a fuse is robust to variations in transistor manufacturing processes provided that the construction of the metal contact remains substantial unaltered. There remains a concern, however, that blowing a metal contact directly connected to a metal layer could compromise the metal layer, with resulting negative consequences.

For instance, blowing a metal contact directly coupled to a barrier-lined metal layer might disrupt a tantalum barrier layer of the metal layer. A disrupted barrier could allow free copper in the metal layer to diffuse into the silicon substrate or silicon-containing intrametal or interlayer dielectrics, with resultant degradation in the long-term reliablity of active devices in the integrated circuit. The present invention obviates these concerns by providing a semiconductor device fuse that leverages the reliable blow properties of a metal contact while reducing the risk that blowing the fuse could damage the metal layer.

Figure 1:
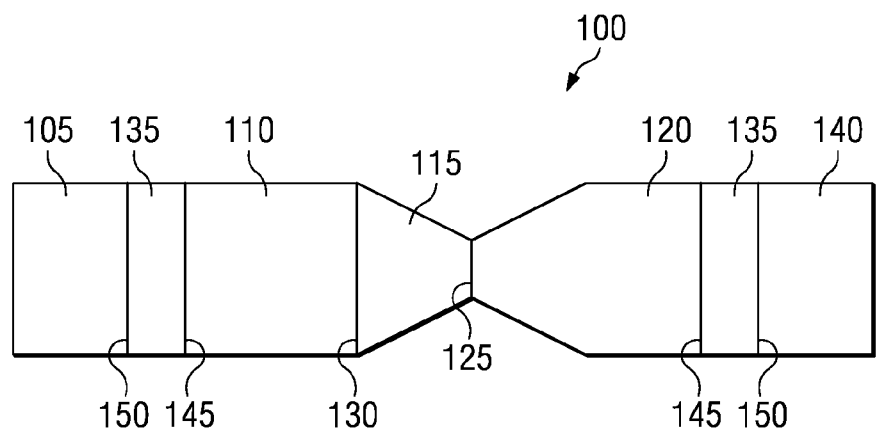
FIG. 1 presents a connectivity diagram of an exemplary semiconductor device fuse constructed according to the present invention.

One embodiment of the present invention is a semiconductor device fuse. FIG. 1 presents a connectivity diagram of an exemplary semiconductor device fuse 100 constructed according to the present invention. The semiconductor device fuse 100 comprises a metal layer 105 and a first semiconductor layer 110. The first semiconductor layer 110 electrically couples the metal layer 105 to a fuse layer 115. The fuse layer 115 is spaced apart from the metal layer 105. Separating the metal layer 105 and fuse layer 115 reduces the risk of damaging the metal layer 105 when the fuse 100 is blown.

The semiconductor device fuse 100 further comprises a second semiconductor layer 120 that forms a blow junction interface 125 with the fuse layer 115. The blow junction interface 125 is configured to form an open circuit when a predefined power is transmitted through the second semiconductor layer 120 to the fuse layer 115. One of ordinary skill in the art would be familiar with how to select the appropriate power to transmit so that the energy density of the blow junction interface 125 is exceeded with consequent melting or vaporization.

In some cases the metal layer 105 preferably comprises a copper layer surrounded by a tantalum barrier layer. One of ordinary skill in the art would be familiar with other suitable materials for the metal layer 105. For instance the metal layer 105 could alternately comprise an aluminum layer surrounded by a titanium-tungsten or titanium-nickel barrier layer. Other embodiments of the metal layer 105 can comprise gold or platinum.

It is advantageous for the first semiconductor layer 110 to be located between the metal layer 105 and the fuse layer 115 so that applying power to the fuse layer 115 does not cause excessive heating of the metal layer 105. In the context of the present invention excessive heating is defined as an increase in temperature that is sufficient to alter the structure of the metal layer 105. Melting a barrier layer of the metal layer 105 is one example of how excessive heating could alter the structure of the metal layer 105. The first and second semiconductor layers 110, 120 can be made of the same or different semiconductor materials. Examples of suitable materials for the semiconductor layers 110, 120 comprise doped silicon or polysilicon; other suitable materials would be readily apparent to those of ordinary skill in the art. Preferably the first and second semiconductor layers 110, 120 are electrically isolated from each other, for example by being separated from each other.

Preferred embodiments of the fuse layer 115 comprise tungsten. However, the fuse layer 115 can also comprise tungsten alloys or other metals conventionally used to form conventional metal contacts in an integrated circuit. The blow junction interface 125 refers to the location where the fuse layer 115 contacts the second semiconductor layer 120. A suitable power is transmitted through the second semiconductor layer 120 to the fuse layer 115 to melt or vaporize portions of the second semiconductor layer 120 or fuse layer 115 at the interface 125, resulting in the formation of an open circuit between the fuse layer 115 and the second semiconductor layer 120.

To help ensure that an open circuit is formed at the blow junction interface 125, it is desirable to configure the resistances of all interfaces of the various components of the fuse 100 to be lower than that of the blow junction interface 125. In some advantageous embodiments, a lower resistance is achieved by making the area of these interfaces greater than the area of the blow junction interface 125. As an example, it is preferable for an area of the blow junction interface 125 to be less than an area of an interface 130 between the first semiconductor layer 110 and the fuse layer 115. More preferably the area of the blow junction interface 125 is at least about five times lower than the area of the interface 130. Preferably there are metal contacts 135 between the first semiconductor layer 110 and the metal layer 105, and between the second semiconductor layer 120 and an additional metal layer 140. To lower their resistance, it desirable for areas of interfaces 145 between the first and second semiconductor layers 110, 120 and the metal contacts 135 to be larger, and preferably at least about five times larger, than the area of the blow junction interface 125. Analogous relative area considerations apply to the interfaces 150 between the metal contacts 135 and metal layers 105, 140.

Figure 2:
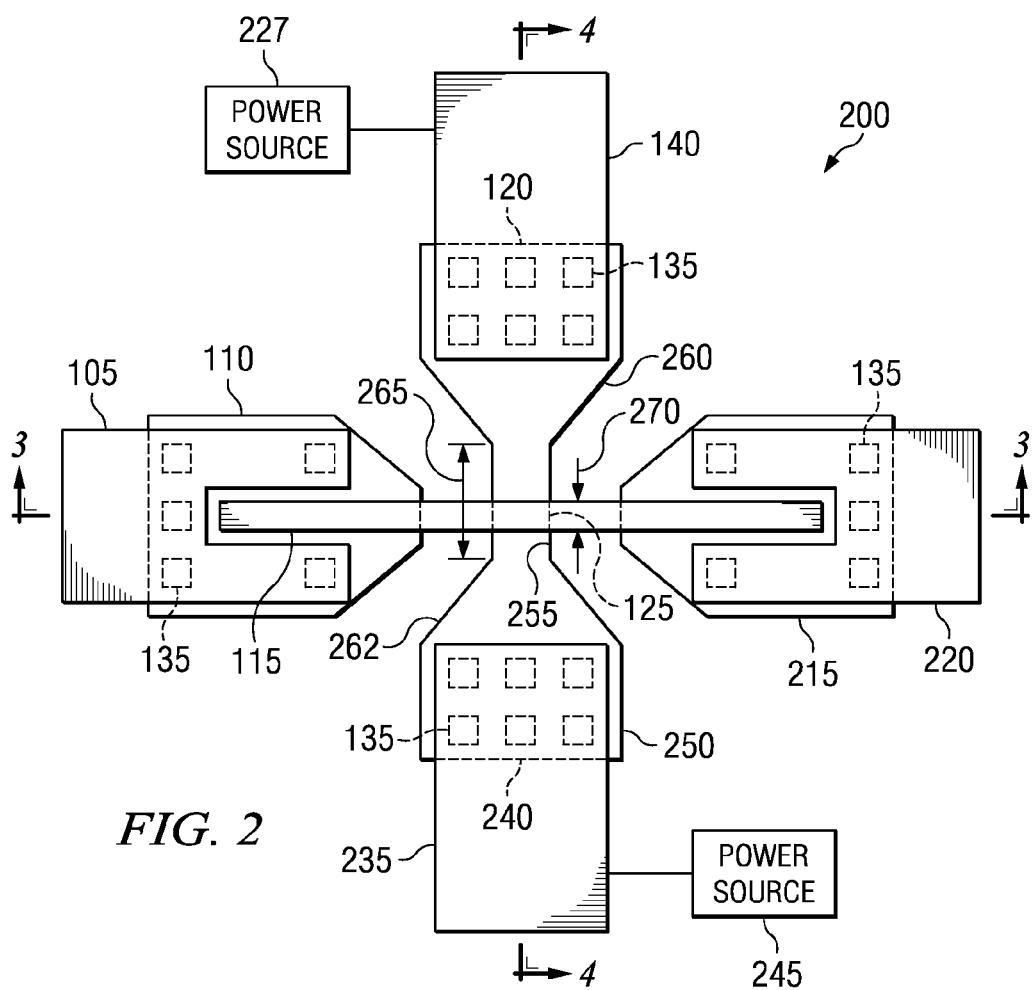
FIG. 2 presents a plan view of another exemplary semiconductor device fuse constructed according to the present invention.
Figure 3:
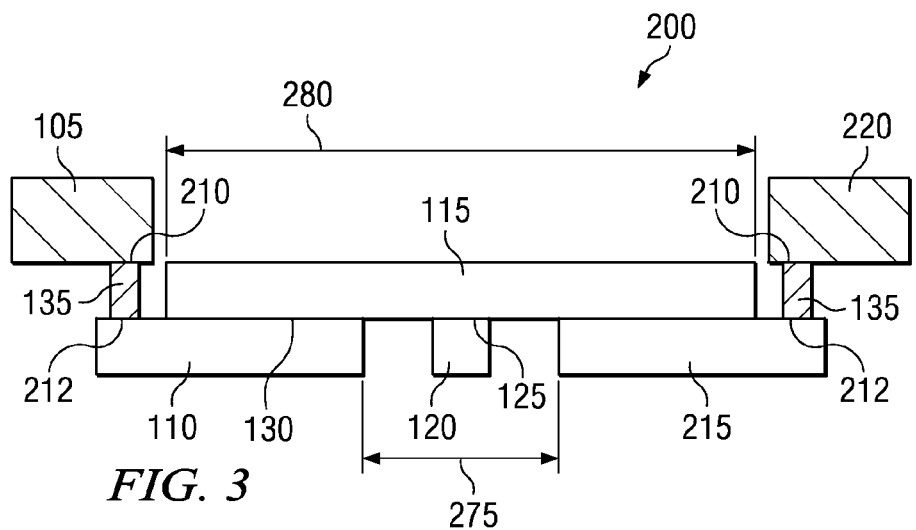
FIG. 3 presents a cross-sectional view of the exemplary semiconductor device fuse presented in FIG. 2.
Figure 4:
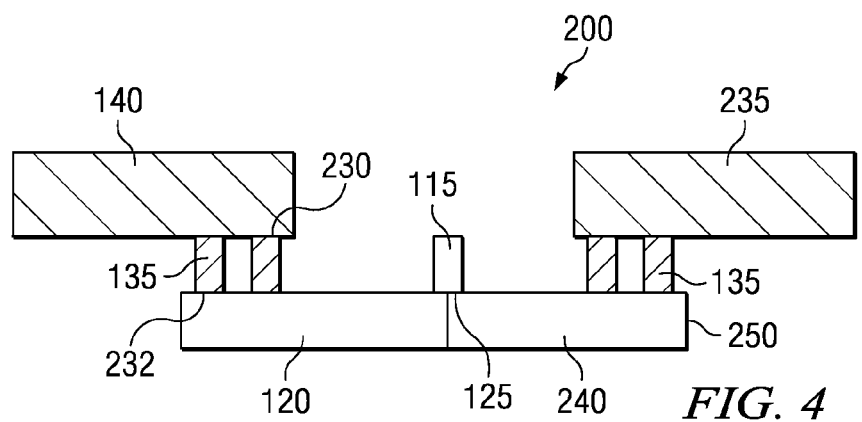
FIG. 4 presents another cross-sectional view of the exemplary semiconductor device fuse presented in FIG. 2.

Some preferred embodiments of the semiconductor device fuse of the present invention further comprise redundant features, such as additional metal layers, and metal contacts between the metal layers and the semiconductor layers. These and other advantageous features are illustrated in FIGS. 2-4. FIG. 2 shows a plan view of another exemplary semiconductor device fuse 200, while FIGS. 3 and 4 illustrate cross-sectional views of the device fuse 200 along view lines 3-3 and 4-4, respectively, as depicted in FIG. 2. The same reference numbers used in FIG. 1 are used to depict analogous structures of the device fuse 200 shown in FIGS. 2-4.

In some cases such as illustrated in FIGS. 2-4, at least one metal contact 135 is located between the metal layer 105 and the first semiconductor layer 110. In such embodiments the electrical coupling of the metal layer 105 to the fuse layer 115 is through one or more metal contacts 135 located between the metal layer 105 and the first semiconductor layer 110. By separating the metal layer 105 from the first semiconductor layer 110, the metal contact 135 beneficially reduces the likelihood that metal atoms of the metal layer 105 will contaminate the first semiconductor layer 110. The metal contact 135 also beneficially further separates the metal layer 105 from the fuse layer 115.

As illustrated in FIG. 3, to help ensure that an open circuit is formed at the blow junction interface 125, it is desirable to reduce the resistance of an interface 210 between the metal contacts 135 and metal layer 105 as compared to the blow junction interface 125. Analogous configurations can be used to reduce the resistance of an interface 212 between the metal contacts 135 and first semiconductor layer 110 as compared to the blow junction interface 125. In some preferred embodiments, for example, an area of the blow junction interface 125 is less than, and more preferably at least about five times less, an area of the interface 210 between the metal contact 135 and metal layer 105, or an area of the interface 212 between metal contact 135 and first semiconductor layer 110. In some preferred embodiments such as illustrated in FIGS. 2-4, a plurality of metal contacts 135 are employed to further increase the total area of these interfaces 210, 212 as compared to the area of the blow junction interface 125. For instance in some cases the total area of the interfaces 210, 212 formed by the plurality of metal contacts 135 is 10 to 20 times greater than the area of the blow junction interface 125.

As further illustrated in FIGS. 2 and 3 the semiconductor device fuse 100 can comprise another semiconductor layer 215 that electrically couples a second metal layer 220 to the fuse layer 115. Coupling redundant features such as the other semiconductor layer 215 and the second metal layer 220 to the fuse layer 115 advantageously further reduces the resistance of the interfaces 130, 210, 212 of the fuse 100 as compared to that of the blow junction interface 125. For the reasons discussed above, it is advantageous to use metal contacts 135 to facilitate electrical coupling between the semiconductor layer 215 and the second metal layer 220. Preferably the other semiconductor layer 215 and second metal layer 220 are composed of substantially the same materials and configured similar to the metal layer 105 and first semiconductor layer 110. Of course different materials and configurations could be used, if desired. In the embodiment depicted in FIGS. 2-4 the metal layer 105 and second metal layer 220 are grounded.

As illustrated in FIGS. 2 and 4 the second semiconductor layer 120 can be coupled to an additional metal layer 140. In some cases the metal layer 105 and additional metal layer 140 are configured to interconnect active or passive device components in an integrated circuit. Again it is advantageous to use metal contacts 135 to facilitate electrical coupling between the second semiconductor layer 120 and additional metal layer 140. In some preferred embodiments the metal layer 140 is coupled to a power source 227 (FIG. 2) configured to transmit or not transmit a predefined power through the second semiconductor layer 120 to the fuse layer 115.

Similar to that discussed above, to ensure that the open circuit is formed at the blow junction interface 125, it is desirable to minimize the resistances between the metal layer 140 and second semiconductor layer 120 and any metal contacts 135 located there-between. For example, in some preferred embodiments of the fuse device 100, the area of the blow junction interface 125 is less than the area of the interfaces 230, 232 (or total area of the interfaces 230, 232 when a plurality of contacts 135 are used) between the metal contacts 135 and the additional metal layer 140 and second semiconductor layer 120.

To increase the areas of these interfaces 230, 232, it is advantageous for the fuse device 100 to comprise redundant features such as the additional metal layer 140 and a matching additional metal layer 235, coupled to the second semiconductor layer 120 and a matching semiconductor layer 240, respectively. In some preferred embodiments the additional metal layer 235 is coupled to a power source 245 configured to transmit or not transmit a predefined power through the matching semiconductor layer 240 to the fuse layer 115 (FIG. 2). In other preferred embodiments the power source 245 is the same as the power source 227 coupled to the second semiconductor layer 120. In other preferred embodiments the second semiconductor layer 120 and matching semiconductor layer 240 are directly coupled to each other thereby forming a contiguous semiconductor layer 250.

As further illustrated in FIGS. 2-4, the pair of metal layer 105 and first semiconductor layer 110, and the pair of the other semiconductor layer 215 and second metal layer 220, and their respective contacts 135, can be configured symmetrically around the fuse layer 115. The pair of second semiconductor layer 120 and additional metal layer 140, and the pair of matching additional metal layer 235 and semiconductor layer 240, and their contacts 135, can also be configured symmetrically around the fuse layer 115.

Such symmetrical configurations beneficially reduce the likelihood that the area of the blow junction interface 125 will be altered by slight misalignments between the semiconductor layers 110, 120, 215, 240 and the fuse layer 115 during fuse fabrication. Device-to-device variation in the area of the blow junction interface 125 is undesirable because this could alter the amount of power required to form an open circuit, thereby reducing the yield of blowing a plurality of device fuses 100 when programming an integrated circuit.

In some preferred embodiments, such as shown in FIG. 2, it is also desirable for a central portion 255 of the contiguous semiconductor layer 250 to be narrower than peripheral portions 260, 262. The central portion 255 corresponds to that region of the contiguous semiconductor layer 250 that is nearest to the fuse layer 115. In some cases a length 265 of the central portion 255 is about 2 times longer than a length 270 of the blow junction interface 125. Such a configuration is tolerant to variations in the location of the semiconductor layers 120, 240. or the contiguous semiconductor layer 250, relative to the fuse layer 115.

For example, consider a scenario where the fuse device 200 is formed such that the fuse layer 115 is not exactly centered over the contiguous semiconductor layer 250. So long as the fuse layer 115 still overlaps with the narrow portion 250, the area of the blow junction interface 125 will not be affected by the misalignment.

Additionally, as illustrated in FIG. 3, it is desirable for the fuse layer 115 to be substantially longer than a gap 275 between the first semiconductor layer 110 and other semiconductor layer 215. In some cases a length 280 of the fuse layer is at least about 50 percent, and more preferably 100 percent longer, than the gap 275. Such configurations tolerate variations in the location of the semiconductor layers 110, 215 relative to the fuse layer 115. For instance, situations can arise where the fuse layer 115 is not exactly centered over the semiconductor layers 110, 215. Provided that the fuse layer 115 still overlaps with semiconductor layers 110, 215, the total area of the interfaces 130 with the fuse layer relative to the area of the blow junction interface 125 will not be affected by the misalignment.

Another aspect of the present invention is a method of manufacturing a semiconductor fuse device. Any of the above-discussed semiconductor fuse devices can be manufactured by the method. FIGS. 5-10 illustrate cross-sectional views of selected steps in an exemplary method of manufacturing a semiconductor fuse device 200 illustrated in FIGS. 2-4 according to the principles of the present invention. The same reference numbers used in FIGS. 1-4 are also used to depict analogous structures of the device fuse 200 shown in FIGS. 5-10.

Figure 5:
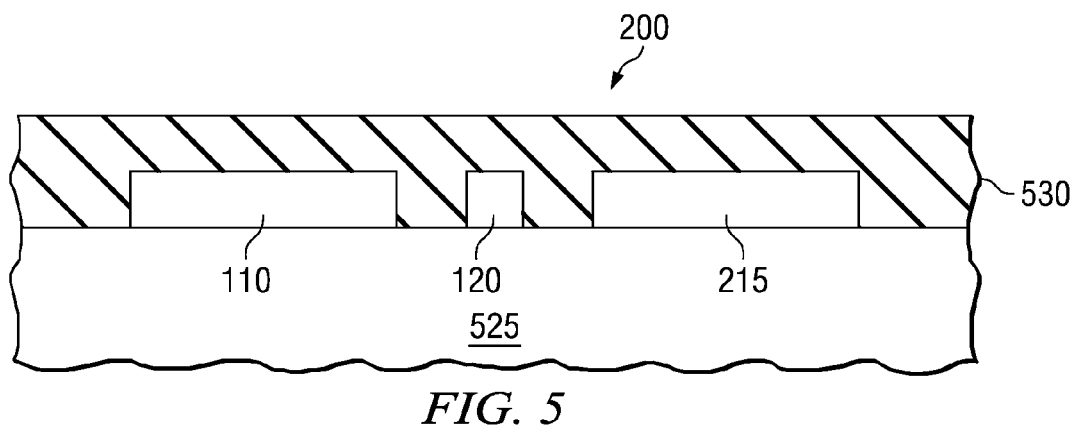
FIGS. 5-10 illustrate cross-sectional views of selected steps in an exemplary method of manufacturing an exemplary semiconductor device according to the principles of the present invention.
Figure 6:
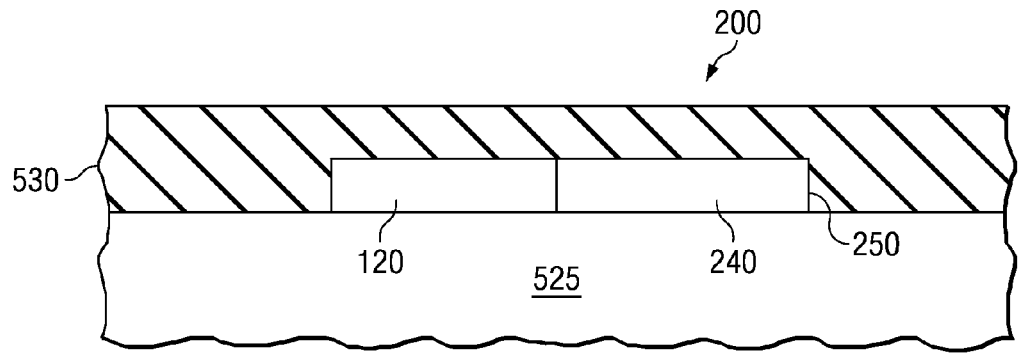

Turning first to FIG. 5, illustrated is cross-sectional view, corresponding to view line 3-3 in FIG. 2, of the partially constructed fuse device 200 after forming semiconductor layers 110, 120, 215 over a substrate 525. FIG. 6 shows an analogous cross-sectional view, corresponding to view line 4-4 in FIG. 2.

The substrate 525 can comprise any conventional semiconductor substrate material used in semiconductor device fabrication. For instance, in certain preferred embodiments, the substrate 525 is a silicon wafer, such as single-crystalline silicon. In other instances the substrate 525 can comprise various layers such as insulating layers to electrically or thermally insulate the fuse device 200 from other components in an integrated circuit (not shown).

Referring to FIG. 5, in certain preferred embodiments the semiconductor layers 110, 120, 215 are formed by blanket depositing a semiconductor material, such as polysilicon, over the substrate 525 and patterning the semiconductor material to form the layers 110, 120, 215. Preferably the semiconductor layers 110, 120, 215 are separated from each other. One of ordinary skill in the art would be familiar with the conventional deposition and patterning techniques that can be used, such as low-pressure chemical vapor deposition (LPCVD) and photolithography. The same procedures can be applied to form the second semiconductor layer 120 and a matching semiconductor layer 240, or a contiguous layer 250, as depicted in FIG. 6.

As further illustrated in FIGS. 5-6, in some preferred embodiments an insulating layer 530, such as silicon oxide, is deposited over semiconductor layers 110, 120, 215, 240, 250 using conventional procedures, such the CVD deposition of tetraethyl orthosilicate (TEOS).

Figure 7:
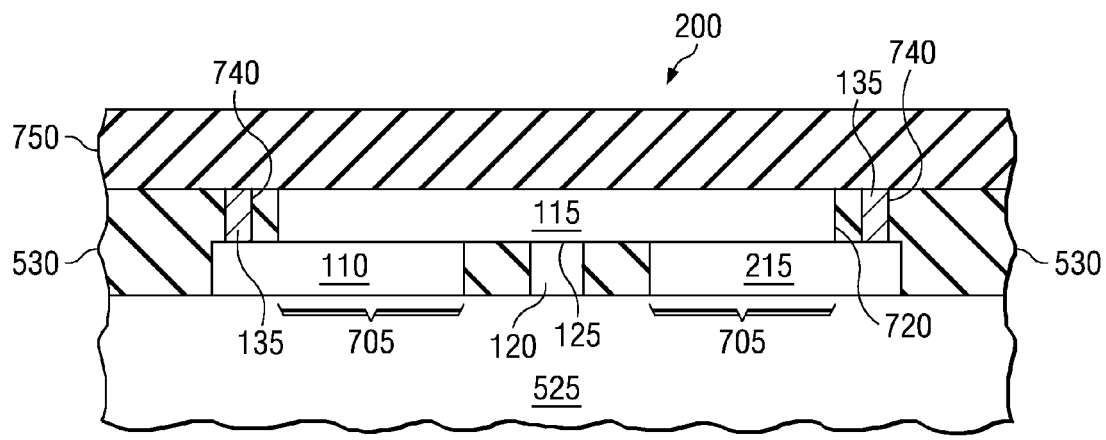
Figure 8:
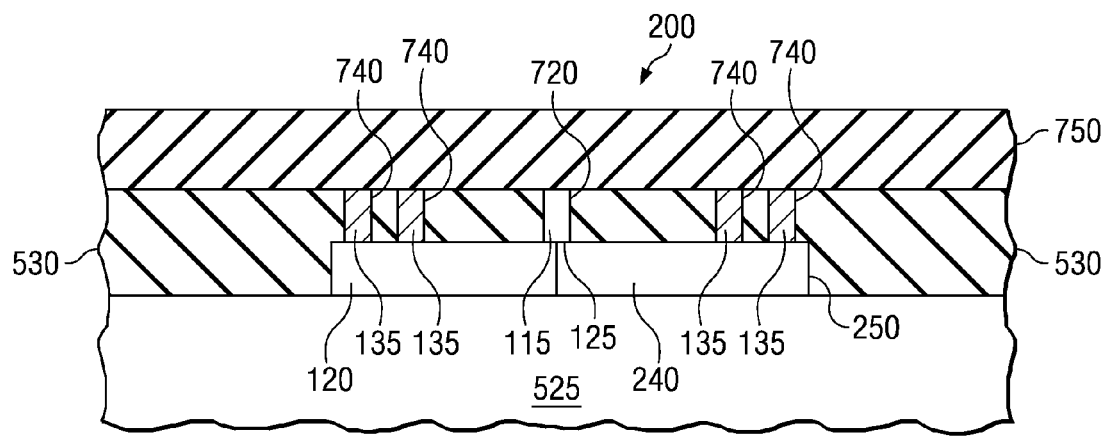

With continuing reference to FIGS. 5-6, FIG. 7 presents a cross-sectional view, corresponding to view line 3-3 in FIG. 2, of the semiconductor fuse device 200 after depositing a fuse layer 115 over the substrate 525. FIG. 8 shows an analogous cross-sectional view, corresponding to view line 4-4 in FIG. 2.

As illustrated in FIG. 7, a portion 705 of the fuse layer 115 is formed on the first semiconductor layer 110 and the other semiconductor layer 215 and the fuse layer 115 forms a blow junction interface 125 with the second semiconductor layer 120. One of ordinary skill in the art would be familiar with various techniques for forming the fuse layer 115. In some cases for instance, radio-frequency plasma etching is used to form an opening 720 in the insulating layer 530. The opening 720 is filled with tungsten or other metals by CVD or physical vapor deposition (PVD) to form the fuse layer 115.

As discussed above, the blow junction interface 125 is configured to form an open circuit when a predefined power is transmitted through the second semiconductor layer 120 to the fuse layer 115. Also as discussed above, to ensure that the open circuit is formed at the blow junction interface 125, it is preferable to make the area of the blow junction interface 125 smaller than the area of the portion 705 of the fuse layer 115 that is on the first or other semiconductor layers 110, 215.

As further illustrated in FIG. 7, in some preferred embodiments one or more metal contacts 135 are formed on the semiconductor layers 110, 215. Similarly, as shown in FIG. 8, metal contacts 135 are formed on the semiconductor layers 120, 240. It is advantageous to use similar procedures and materials to form the metal contacts 135 as used to form the fuse layer 115. Even more preferably, the metal contacts 135 are formed at the same time as the fuse layer 115. For example, the same plasma etching step used to form the opening 720 can also form openings 740 for the metal contacts 135. Likewise the CVD or PVD step to fill the opening 720 with a metal such as tungsten can also fill the opening 740 to form the metal contacts 135. In some preferred embodiments after deposition of the metal of the fuse layer 115 and the metal contacts 135, chemical mechanical polishing (CMP) is performed to planarize the insulating layer 530 and remove any metal outside of the openings 720, 740. The fuse layer 115 and metal contacts 135 are thereby electrically isolated. As further illustrated in FIGS. 7-8, a second insulating layer 750, such as a silicon oxide layer, can be deposited over the fuse layer 115 and the metal contacts 135.

Figure 9:
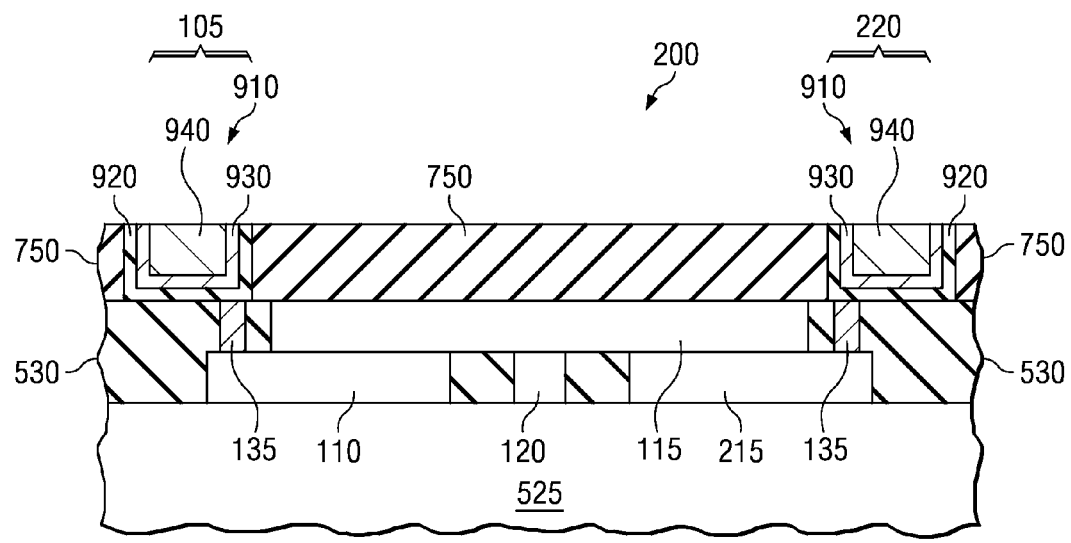

Turning now to FIG. 9, while maintaining reference to FIGS. 5-8, presented is the exemplary semiconductor fuse device 200 after depositing a metal layer 105 over the semiconductor layer 110. Any conventional procedure can be used to deposit the metal layer 105. In some preferred embodiments the metal layer 105 is formed by dry etching to form an opening 910 in the second insulating layer 750. PVD or other conventional procedures can then be performed to conformally deposit a barrier layer 920, such as tantalum, in the opening 910 and to deposit a metal seed layer 930, such as copper, on the barrier layer 920. Preferably a second metal layer 940, such as copper, is deposited on the metal seed layer 930 by a wet process, such as electrochemical deposition or electroless chemical deposition. FIG. 9 also depicts the fuse 200 after planarizing, using convention procedures such as CMP, to remove portions of the barrier layer 920, metal seed layer 930 and excess metal layer 940 lying outside the opening 910.

The metal layer 105 is electrically coupled to the fuse layer 115 through the first semiconductor layer 110, and the metal layer 105 is separated from the fuse layer 115. In some preferred embodiments such as depicted in FIG. 9, the metal layer is deposited on metal contacts 135. The metal contacts 135 facilitate the electrical coupling and the separation between the metal layer 105 and the fuse layer 115.

Figure 10:
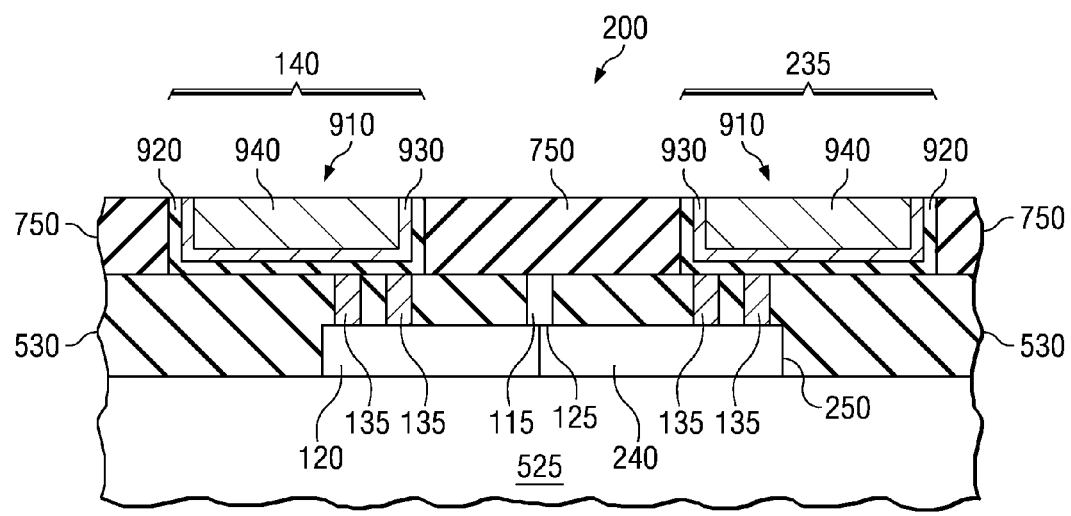

As further shown in FIG. 9, similar procedures can be used to deposit a second metal layer 220 over the second semiconductor layer 215, whereby the second metal layer 220 is electrically coupled to the fuse layer 115. Preferably the second metal layer 220 is deposited on metal contacts 135 to facilitate the electrical coupling and separation between the second metal layer 220 and the fuse layer 115. Analogous procedures can be followed to deposit metal layers 140, 235 over the semiconductor layers 120, 240, and preferably on metal contacts 135, as shown in FIG. 10.

Figure 11:
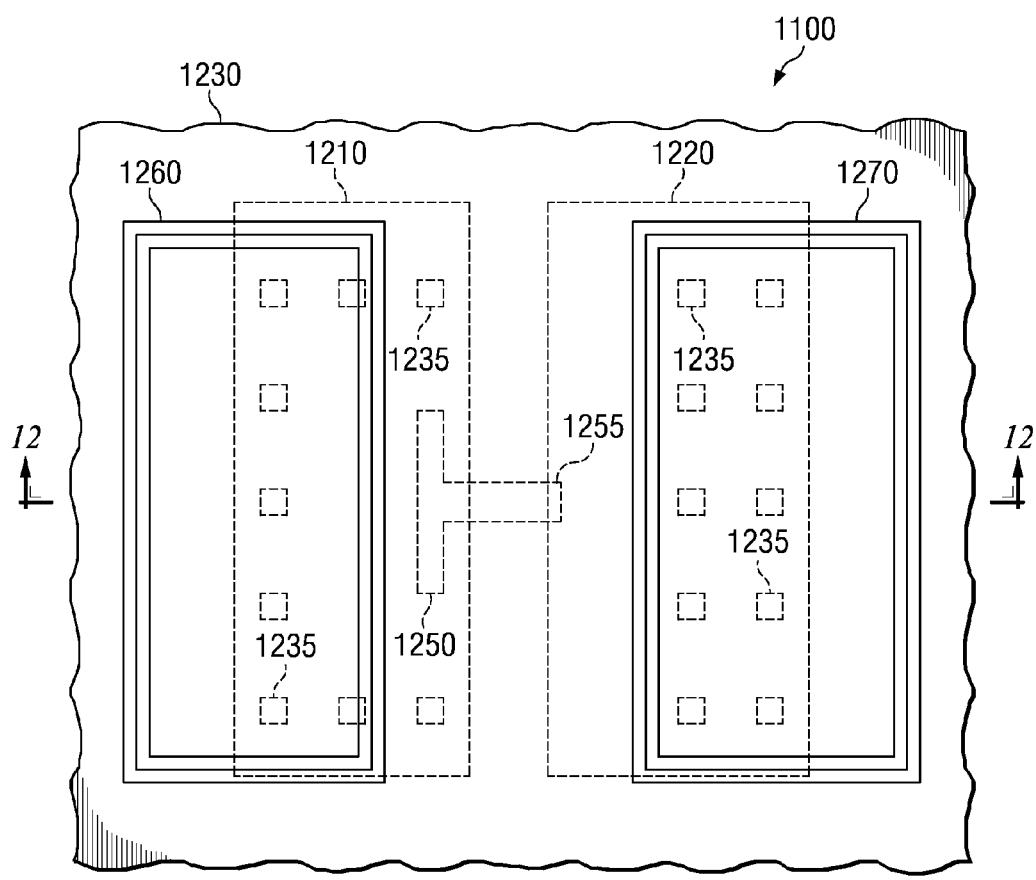
FIG. 11 presents a plan view of yet another exemplary semiconductor device fuse constructed according to the present invention.
Figure 12:
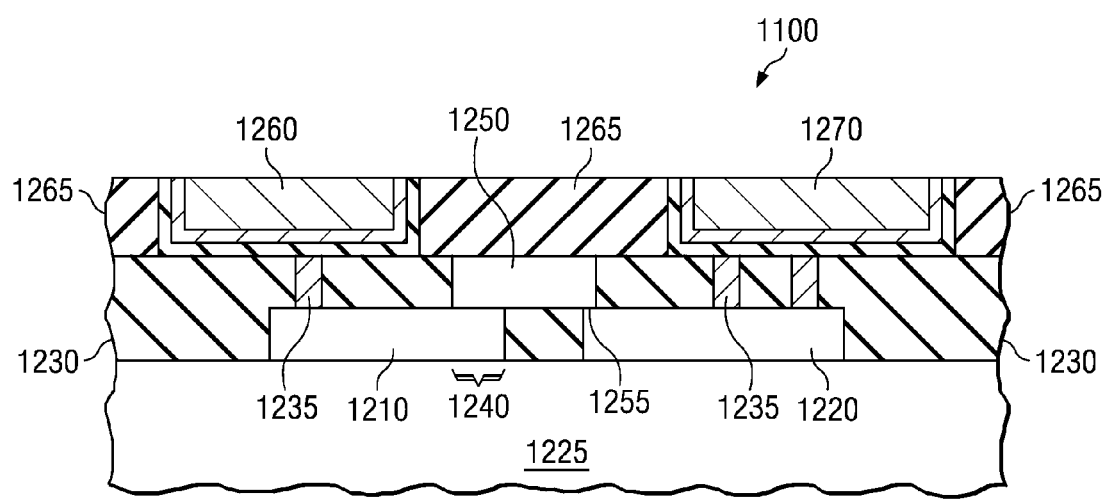
FIG. 12 presents a cross-sectional view of the exemplary semiconductor device fuse presented in FIG. 11.

Turning now to FIG. 11, illustrated is a plan view of an alternative embodiment the semiconductor fuse device 1100. FIG. 12 shows a cross-sectional corresponding to view line 12-12 in FIG. 11.

Turning to FIG. 12, first and second semiconductor layers 1210, 1220 are located over a substrate 1225 and the first and second semiconductor layers 1210, 1220 are in an insulating layer 1230. One or more metal contacts 1235 are formed on the first and second semiconductor layers 1210, 1220. A portion 1240 of a fuse layer 1250 is on the first semiconductor layer 1210 and the fuse layer 1250 forms a blow junction interface 1255 with the second semiconductor layer 1220. The blow junction interface 1255 is configured to form an open circuit when a predefined power is transmitted through the second semiconductor layer 1220 to the fuse layer 1250. To help ensure that the open circuit is formed at the blow junction interface 1255, it is preferable to make the area of the blow junction interface 1255 smaller than the area of the portion 1240 of the fuse layer 1250 that is on the first semiconductor layer 1210.

As further depicted in FIG. 12, a metal layer 1260 is over the first semiconductor layer 1210 and in a second insulating layer 1255. The metal layer 1260 is electrically coupled to the fuse layer 1250 through the first semiconductor layer 1210, and the metal layer 1260 is separated from the fuse layer 1250. The metal layer 1260 is on one or more of the metal contacts 1235. The metal contacts 1235 facilitate the electrical coupling and separation between the metal layer 1260 and the fuse layer 1250.

As further illustrated in FIG. 12, a second metal layer 1270 is over the second semiconductor layer 1220. The second metal layer 1250 is electrically coupled to the fuse layer 1250. Preferably the second metal layer 750 is on metal contacts 630 to facilitate the electrical coupling and separation between the second metal layer 750 and the fuse layer 600.

As illustrated in FIG. 11, a plurality of metal contacts 1235 can be used to couple the metal layers 1260, 1270 to their respective underlying semiconductor layers 1210, 1220. The second insulating layer 1265 is not depicted in FIG. 11 so that underlying structures can be shown more clearly. Numerous different layouts and shapes for the metal contacts 1235 and fuse layer 1250 would be readily apparent to one of ordinary skill in the art. For example, as illustrated in FIG. 11, the fuse layer 1250 can be T-shaped, and in other embodiments, some or all of the metal contacts 1235 can have a rectangular shape.

Figure 13:
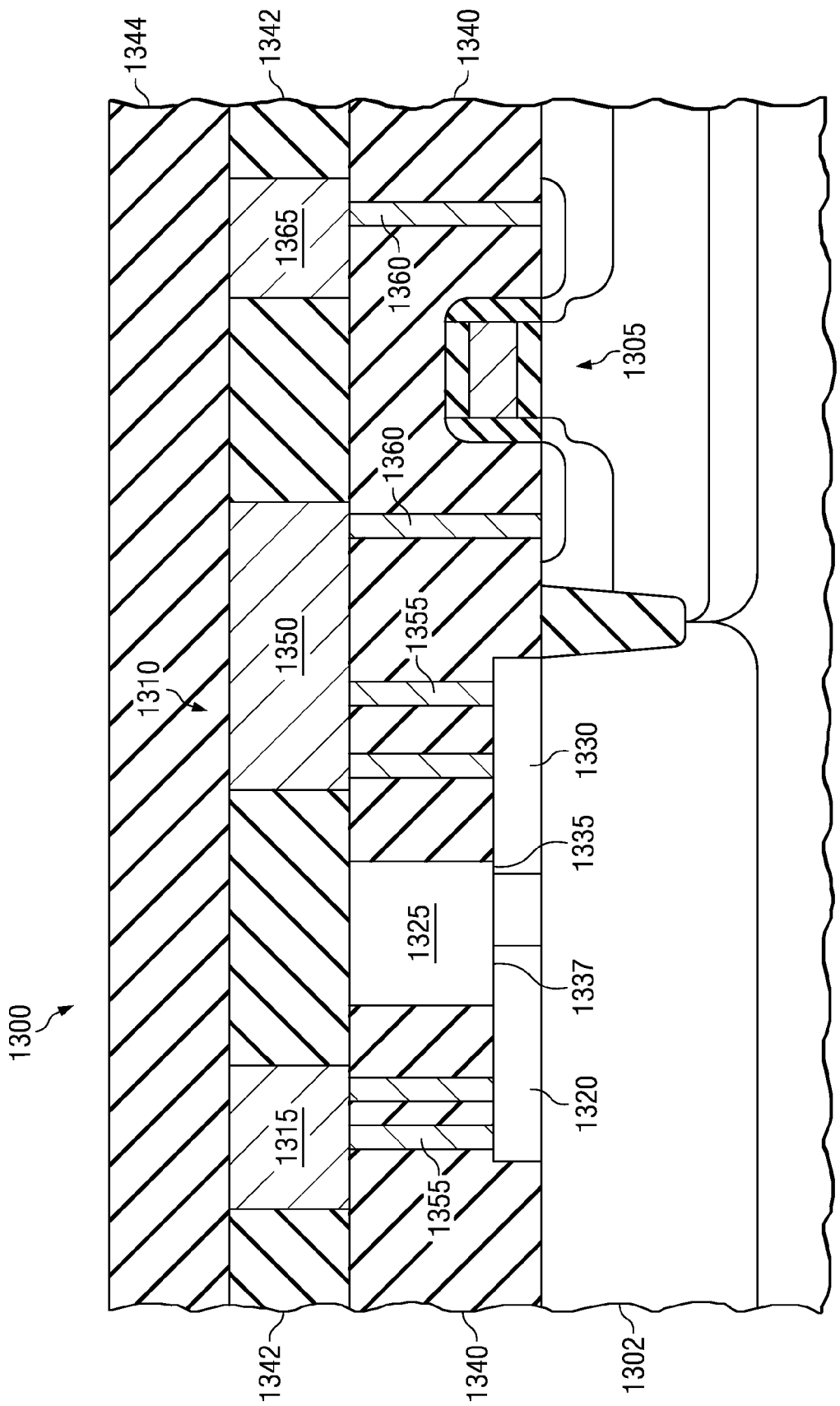
FIG. 13 presents a cross-sectional view of an integrated circuit of the present invention.

Yet another aspect of the present invention is an integrated circuit. FIG. 13 presents a cross-sectional view of an exemplary integrated circuit 1300 of the present invention.

The integrated circuit 1300 comprises a substrate 1302 over which are formed microelectronic devices 1305 and one or more semiconductor device fuses 1310. As illustrated in FIG. 13, some embodiments of the microelectronic devices 1305 comprise a metal-oxide-semiconductor (MOS) transistor. Other embodiments of the microelectronic device 1305 comprise nMOS or pMOS transistors, CMOS, biCMOS devices, bipolar, Junction Field Effect transistors, or other types of active or passive integrated circuit components, and combinations thereof.

Any of the above-described semiconductor fuse devices and their method of manufacture can be incorporated into the construction of a plurality of semiconductor device fuses 1310 of the integrated circuit 1300. Each device fuse 1310 comprises a metal layer 1315 and a first semiconductor layer 1320 that electrically couples the metal layer 1315 to a fuse layer 1325, wherein the fuse layer 1325 is spaced apart from the metal layer 1315.

The device fuse 1310 further comprises a second semiconductor layer 1330 that forms a blow junction interface 1335 with the fuse layer 1325. The blow junction interface 1335 is configured to form an open circuit when a predefined power is transmitted through the second semiconductor layer 1330 to the fuse layer 1325. To promote forming the open circuit at the blow junction interface 1335, it is preferable that an area of the blow junction interface 1335 is less than an area of an interface 1337 between the first semiconductor layer 1320 and the fuse layer 1325.

As further illustrated in FIG. 13 preferred embodiments of the integrated circuit 1300 further comprise a plurality of insulating layers 1340, 1342, 1344 configured to electrically or thermally insulate the semiconductor device fuse 1300 from other components of the integrated circuit 1300, such as the microelectronic devices 1305. The insulating layers 1340, 1342, 1344 can also be configured to electrically isolate or separate different components of the fuse device 1310. For example, for the embodiment shown in FIG. 13, the insulating layer 1340 is configured to electrically isolate the first and second semiconductor layers 1320, 1330 from each other.

As discussed previously, some preferred embodiments of the semiconductor device fuse 1300 comprise a second metal layer 1350 that is electrically coupled to the fuse layer 1325 through the second semiconductor layer 1330. In other preferred embodiments, to facilitate electrical coupling, one or more metal contacts 1355 are located between the first semiconductor layer 1320 and metal layer 1315 or between the second semiconductor layer 1330 and second metal layer 1350. Of course the integrated circuit 1300 can further comprise additional metal contacts 1360 and metal layer 1365 to interconnect the microelectronic devices 1305 and form an operative device.

Each semiconductor device fuse 1310 is configured to be programmed to thereby interconnect the microelectronic devices 1305 to form an operative device, such as a programmed read-only memory (PROM) device. For instance, in some embodiments, the metal layer 1315 and second metal layer 1350 comprise portions of a first layer of metallization in the integrated circuit 1300. In such cases, the metal layer 1315 and second metal layer 1350 are configured to interconnect the microelectronic devices 1305. Of course, the semiconductor device fuse 1310 can also be located at higher layers of metallization and insulation of the integrated circuit, if desired.

In some instances, the semiconductor device fuse 1310 is programmed by leaving the blow junction interface 1335 intact, thereby maintaining the interconnection between the microelectronic devices 1305. In other instances the semiconductor device fuse 1310 is programmed by sending a pulse of power to the blow junction interface 1335 to form an open circuit, thereby breaking the interconnection between the microelectronic devices 1305.

Although the present invention has been described in detail, those skilled in the art should understand that they can make various changes, substitutions and alterations herein without departing from the scope of the invention in its broadest form.

What is claimed is:

1. A semiconductor device fuse, comprising:
a first semiconductor region;
a second semiconductor region spaced from said first semiconductor region;
a fuse layer formed with portions on and extending between said first and second semiconductor regions;
a first metal layer;
at least one first contact extending between said first metal layer and said first semiconductor region;
wherein said first metal layer is electrically coupled to said fuse layer through said at least one first contact and said first semiconductor region; and said portion of said fuse layer on said second semiconductor region defines a blow junction interface configured to form an open circuit when a predefined power is transmitted between said second semiconductor region and said fuse layer.

2. The semiconductor device fuse of claim 1, wherein said portion of said fuse layer on said first semiconductor region defines an interface having a resistance less than a resistance of said blow junction interface.

3. The semiconductor device fuse of claim 1, wherein said at least one first contact defines an interface with said first semiconductor region having a combined total resistance less than a resistance of said blow junction interface.

4. The semiconductor device fuse of claim 1, wherein said at least one first contact comprises a plurality of first contacts, with said plurality of first contacts defining an interface with said first semiconductor region having a combined total area greater than an area of said blow junction interface.

5. The semiconductor device fuse of claim 1, wherein said first metal layer comprises a copper or aluminum layer surrounded by a barrier layer.

6. The semiconductor device fuse of claim 1, wherein said first metal layer comprises copper surrounded by tantalum, or aluminum surrounded by titanium-tungsten or titanium-nickel.

7. The semiconductor device fuse of claim 1, wherein said fuse layer comprises tungsten.

8. The semiconductor device fuse of claim 1, wherein at least one of said first and second semiconductor regions comprises doped silicon or polysilicon.

9. The semiconductor device fuse of claim 1, wherein said first metal layer comprises copper surrounded by a barrier material; said first and second semiconductor regions comprise doped silicon or polysilicon; and said fuse layer comprises tungsten.

10. The semiconductor device fuse of claim 1, wherein the fuse layer is a T-shaped layer having a top of the T shape located over the first semiconductor region and a base of the T shape located over the second semiconductor region.

11. The semiconductor device fuse of claim 1, wherein said portion of said fuse layer on said first semiconductor region defines an interface having an area greater than an area of said blow junction interface.

12. The semiconductor device fuse of claim 11, wherein said portion of said fuse layer on said first semiconductor region defines an interface having an area at least five times greater than an area of said blow junction interface.

13. The semiconductor device fuse of claim 1, wherein said at least one first contact defines an interface with said first semiconductor region having a combined total area greater than said area of said blow junction interface.

14. The semiconductor device fuse of claim 13, wherein said at least one first contact defines an interface with said first semiconductor region having a combined total area 10 to 20 times greater than said area of said blow junction interface.

15. The semiconductor device fuse of claim 1, further comprising a second metal layer; and at least one second contact extending between said second metal layer and said second semiconductor region; wherein said second metal layer is electrically coupled to said fuse layer through said at least one second contact and said second semiconductor region.

16. The semiconductor device fuse of claim 15, wherein said portion of said fuse layer on said first semiconductor region defines an interface having a resistance less than a resistance of said blow junction interface; said at least one first contact defines an interface with said first semiconductor region having a combined total resistance less than said resistance of said blow junction interface; and said at least one second contact defines an interface with said second semiconductor region having a combined total resistance less than said resistance of said blow junction interface.

17. The semiconductor device fuse of claim 15, wherein said portion of said fuse layer on said first semiconductor region defines an interface having an area greater than an area of said blow junction interface; said at least one first contact defines an interface with said first semiconductor region having a combined total area greater than said area of said blow junction interface; and said at least one second contact defines an interface with said second semiconductor region having a combined total area greater than said area of said blow junction interface.

18. The semiconductor device fuse of claim 15, wherein interfaces, other than said blow junction interface, between ones of said first metal layer, said at least one first contact, said first semiconductor region, said fuse layer, said second semiconductor region, said at least one second contact, and said second metal layer have resistances lower than a resistance of said blow junction interface.

19. The semiconductor device fuse of claim 15, wherein interfaces, other than said blow junction interface, between ones of said first metal layer, said at least one first contact, said first semiconductor region, said fuse layer, said second semiconductor region, said at least one second contact, and said second metal layer have total areas greater than an area of said blow junction interface.

20. The semiconductor device fuse of claim 15, wherein said at least one first contact comprises a plurality of first contacts, with said plurality of first contacts defining an interface with said first semiconductor region having a combined total area greater than an area of said blow junction interface; and said at least one second contact comprises a plurality of second contacts, with said plurality of second contacts defining an interface with said second semiconductor region having a combined total area greater than an area of said blow junction interface.

21. The semiconductor device fuse of claim 15, wherein said first and second metal layers comprise copper or aluminum layers surrounded by barrier layers.

22. The semiconductor device fuse of claim 15, wherein said first and second metal layers comprise copper surrounded by tantalum, or aluminum surrounded by titanium-tungsten or titanium-nickel.

23. The semiconductor device fuse of claim 15, wherein said fuse layer comprises tungsten.

24. The semiconductor device fuse of claim 15, wherein said first and second semiconductor regions comprise doped silicon or polysilicon.

25. The semiconductor device fuse of claim 15, wherein said first and second metal layers comprise copper surrounded by a barrier material; said first and second semiconductor regions comprise doped silicon or polysilicon; and said fuse layer comprises tungsten.

26. The semiconductor device fuse of claim 15, further comprising a first insulating layer formed over said first and second semiconductor regions; and a second insulating layer formed over said fuse layer; wherein:
   said first and second semiconductor regions comprise first and second regions of a semiconductor material on a substrate;
   said fuse layer comprises fuse metal filling an opening in said first insulating layer;
   said at least first and at least second contacts comprise first and second contacts formed in other openings in said first insulating layer; and
   said first and second metal layers comprise metal filling openings within said second insulating layer.

27. The semiconductor device fuse of claim 26, wherein said semiconductor material comprises doped silicon or polysilicon; said fuse metal comprises tungsten; and said first and second layer metal comprises copper.

28. The semiconductor device fuse of claim 15, further comprising:
   a third semiconductor region spaced from said first and second semiconductor regions, with said fuse layer formed with a portion on said third semiconductor region, and said portion of said fuse layer on said second semiconductor region is located intermediate said portions of said fuse layer on said first and third semiconductor regions;
   a third metal layer; and
   at least one third contact extending between said third metal layer and said third semiconductor region;
   wherein said third metal layer is electrically coupled to said fuse layer through said at least one third contact and said third semiconductor region.

29. The semiconductor device fuse of claim 28, wherein said first metal layer and said first semiconductor region are configured symmetrically with said third metal layer and said third semiconductor region around said fuse layer.

30. The semiconductor device fuse of claim 29, wherein said at least first contact and said at least third contact are configured symmetrically around said fuse layer.

31. The semiconductor device fuse of claim 28, further comprising:
   a fourth semiconductor region spaced from said first and third semiconductor regions, with a portion of said fuse layer formed on said fourth semiconductor region at a location intermediate said portions of said fuse layer on said first and third semiconductor regions;
   a fourth metal layer;
   at least one fourth contact extending between said fourth metal layer and said fourth semiconductor region;
   wherein said fourth metal layer is electrically coupled to said fuse layer through said at least one fourth contact and said fourth semiconductor region.

32. The semiconductor device fuse of claim 31, wherein said second and fourth semiconductor regions form a contiguous semiconductor region.

33. The semiconductor device fuse of claim 31, wherein said first metal layer and said first semiconductor region are configured symmetrically with said third metal layer and said third semiconductor region around said fuse layer; and said second metal layer and said second semiconductor region are configured symmetrically with said fourth metal layer and said fourth semiconductor region around said fuse layer.

34. The semiconductor device fuse of claim 33, wherein said at least first contact and said at least third contact are configured symmetrically around said fuse layer; and wherein said at least second contact and said at least fourth contact are configured symmetrically around said fuse layer.

35. The semiconductor device fuse of claim 34, wherein said second and fourth semiconductor regions form a contiguous semiconductor region having a narrow central portion overlapped by said fuse layer.

36. The semiconductor device fuse of claim 35, wherein a length of said narrow central portion is about 2 times longer than a length of said blow junction interface.

37. The semiconductor device fuse of claim 36, wherein said fuse layer is longer than a gap between the first semiconductor region and the third semiconductor region.

38. The semiconductor device fuse of claim 37, wherein said fuse layer is at least about 50 percent longer than said gap.

39. The semiconductor device fuse of claim 38, wherein said first, second, third and fourth metal layers comprise copper surrounded by a barrier material; said first, second, third and fourth semiconductor regions comprise doped silicon or polysilicon; and said fuse layer comprises tungsten.

40. The semiconductor device fuse of claim 31, further comprising a first insulating layer formed over said first, second, third and fourth semiconductor regions; and a second insulating layer formed over said fuse layer; wherein:
    said first, second, third and fourth semiconductor regions comprise a semiconductor material on a substrate;
    said fuse layer comprises metal filling an opening in said first insulating layer;
    said at least first, at least second, at least third, and at least fourth contacts comprise conductive contacts formed in other openings in said first insulating layer; and
    said first, second, third and fourth metal layers comprise metal filling openings within said second insulating layer.

41. The semiconductor device fuse of claim 40, wherein said semiconductor material comprises doped silicon or polysilicon; said fuse layer metal comprises tungsten; and said first and second layer metal comprises copper.

42. A semiconductor device fuse, comprising:
    first and second semiconductor regions formed in separated positions on a substrate;
    a first insulating layer formed over said first and second semiconductor regions;
    a metal fuse layer element formed within an opening in said first insulating layer; a first portion of said fuse layer element formed in direct contact on said first semiconductor region; and a second portion of said fuse layer element formed in direct contact on and forming a blow junction interface with said second semiconductor region;
    a second insulating layer formed over said first insulating layer and over said metal fuse layer element;
    first and second metal regions formed within openings in said second insulating layer in positions separated from said metal fuse layer element;
    contacts formed within other openings in said first insulating layer; ones of said contacts electrically coupling said first metal region to said fuse layer element through said first semiconductor region; and others of said contacts electrically coupling said second metal region to said fuse layer element through said second semiconductor region.

43. The semiconductor device fuse of claim 42, wherein said first and second semiconductor regions comprise doped silicon or polysilicon; said metal fuse layer element comprises tungsten; and said first and second metal regions comprise copper.

* * * * *